(12) United States Patent
Hsu et al.

(10) Patent No.: US 11,121,682 B1
(45) Date of Patent: Sep. 14, 2021

(54) SINGLE-STAGE BOOST CLASS-D AMPLIFIER

(71) Applicant: Elite Semiconductor Microelectronics Technology Inc., Hsinchu (TW)

(72) Inventors: Che-Wei Hsu, Hsinchu (TW); Wun-Long Yu, Hsinchu (TW); Deng-Yao Shih, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 0 days.

(21) Appl. No.: 17/012,072

(22) Filed: Sep. 4, 2020

(51) Int. Cl.
*H03F 3/217* (2006.01)
*H03F 1/02* (2006.01)

(52) U.S. Cl.
CPC ..... *H03F 3/2171* (2013.01); *H03F 2200/156* (2013.01); *H03F 2200/351* (2013.01)

(58) Field of Classification Search
CPC ............. H03F 3/2171; H03F 2200/156; H03F 2200/351
USPC ....................................... 330/10, 207 A, 251
See application file for complete search history.

(56) References Cited

U.S. PATENT DOCUMENTS

| 7,403,400 | B2 | 7/2008 | Stanley |
| 8,643,436 | B2 | 2/2014 | Ni |
| 9,000,690 | B2 | 4/2015 | Garg |
| 9,231,583 | B2* | 1/2016 | Hoyerby .............. H03K 17/063 |
| 9,806,682 | B1 | 10/2017 | Marcone |
| 10,554,185 | B2* | 2/2020 | Hoyerby .............. H03F 3/2173 |

FOREIGN PATENT DOCUMENTS

| CN | 104335475 B | 7/2018 |
| CN | 110809890 A | 2/2020 |
| TW | 200812435 | 3/2008 |

* cited by examiner

*Primary Examiner* — Hieu P Nguyen
(74) *Attorney, Agent, or Firm* — Winston Hsu

(57) ABSTRACT

A boost class-D amplifier includes a PWM modulator, a boost level controller coupled to the PWM modulator, a pre-driver coupled to the PWM modulator and the boost level controller, a system voltage source, an inductor coupled to the system voltage source, a first switch, a second switch, a third switch, a fourth switch, a first diode coupled between the third switch and a voltage ground, a second diode coupled between the fourth switch and the voltage ground, and a capacitor coupled between the first switch and the fourth switch. The PWM modulator is for receiving an input signal and generating a first modulated signal accordingly. The boost level controller is for receiving the first modulated signal and generating a second modulated signal accordingly. The pre-driver is for receiving the first modulated signal and the second modulated signal and generating control signals accordingly.

14 Claims, 8 Drawing Sheets

SINGLE-STAGE BOOST CLASS-D AMPLIFIER

BACKGROUND OF THE INVENTION

1. Field of the Invention

The invention is related to class-D amplifiers, and more particularly to class-D amplifiers combining the function of boost converters for increasing the output voltage and improving electrical power conversion efficiency by a single-stage topology.

2. Description of the Prior Art

Class-D amplifiers are generally recognized to provide an energy efficient audio drive for loudspeaker loads by switching pulse width modulation (PWM) signals across the loudspeaker load. It is a known type of audio power amplifier. Typically, a class-D amplifier is a pair of output terminals that connect to each side or terminal of a loudspeaker load to apply an opposite phase pulse width modulated audio signal across the loudspeaker. H-bridge driver having several modulation schemes for pulse width modulated audio signals is utilized in PWM based class-D amplifiers. In AD modulation, the pulse width modulated audio signal is switched or toggled between two different levels of antiphase at each output terminal or node of the H-bridge. In BD modulation, the pulse width modulated signal over the loudspeaker load is switched alternately between three levels, and BD modulation has significant common mode content in its output.

A boost converter is a DC-to-DC power converter that steps up voltage from its input (supply) to its output (load). It is a class of switched-mode power supply containing a diode, a switch and at least one energy storage element: capacitor and/or inductor. To reduce voltage ripple, filters formed by capacitors and inductors are normally added to the output and the input of the boost converter.

One disadvantage of previously implementation is the fact that they usually need a separate boost converter to generate the high voltage to drive a class-D amplifier that the power loss may be significant. A new driver architecture that combining the boost converter stage and the amplifier in a single stage is proposed to improve electrical power conversion efficiency.

SUMMARY OF THE INVENTION

The embodiment provides a boost class-D amplifier including a PWM (pulse width modulation) modulator, a boost level controller coupled to the PWM modulator, a pre-driver coupled to the PWM modulator and the boost level controller, a system voltage source, an inductor coupled to the system voltage source, a first switch, a second switch, a third switch, a fourth switch, a first diode coupled between the third switch and a voltage ground, a second diode coupled between the fourth switch and the voltage ground, and a capacitor coupled between the first switch and the fourth switch. The PWM modulator is for receiving an input signal and generating a first modulated signal accordingly. The boost level controller is for receiving the first modulated signal and generating a second modulated signal accordingly. The pre-driver is for receiving the first modulated signal and the second modulated signal and generating a first control signal, a second control signal, a third control signal and a forth control signal accordingly. The system voltage source is for providing a system voltage. The first switch includes a first terminal coupled to the inductor, a second terminal, and a control terminal coupled to the pre-driver for receiving the first control signal. The second switch includes a first terminal coupled to the inductor, a second terminal, and a control terminal coupled to the pre-driver for receiving the second control signal. The third switch includes a first terminal coupled to the second terminal of the first switch, a second terminal, and a control terminal coupled to the pre-driver for receiving the third control signal. The fourth switch includes a first terminal coupled to the second terminal of the second switch, a second terminal, and a control terminal coupled to the pre-driver and for receiving the fourth control signal.

Another embodiment provides a boost class-D amplifier including a PWM (pulse width modulation) modulator, a boost level controller coupled to the PWM modulator, a pre-driver coupled to the PWM modulator and the boost level controller, a system voltage source, an inductor coupled to the system voltage source, a first switch, a second switch, a third switch, a fourth switch, a first diode coupled between the third switch and a voltage ground, a second diode coupled between the fourth switch and the voltage ground, a capacitor coupled between the first switch and the fourth switch, and a feedback circuit coupled to both terminals of the capacitor, the boost level controller and the PWM modulator. The PWM modulator is for receiving an input signal and generating a first modulated signal accordingly. The boost level controller is for receiving the first modulated signal and generating a second modulated signal accordingly. The pre-driver is for receiving the first modulated signal and the second modulated signal and generating a first control signal, a second control signal, a third control signal and a forth control signal accordingly. The system voltage source is for providing a system voltage. The first switch includes a first terminal coupled to the inductor, a second terminal, and a control terminal coupled to the pre-driver for receiving the first control signal. The second switch includes a first terminal coupled to the inductor, a second terminal, and a control terminal coupled to the pre-driver for receiving the second control signal. The third switch includes a first terminal coupled to the second terminal of the first switch, a second terminal, and a control terminal coupled to the pre-driver for receiving the third control signal. The fourth switch includes a first terminal coupled to the second terminal of the second switch, a second terminal, and a control terminal coupled to the pre-driver and for receiving the fourth control signal. The feedback circuit is for modulating the first modulated signal and the second modulated signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
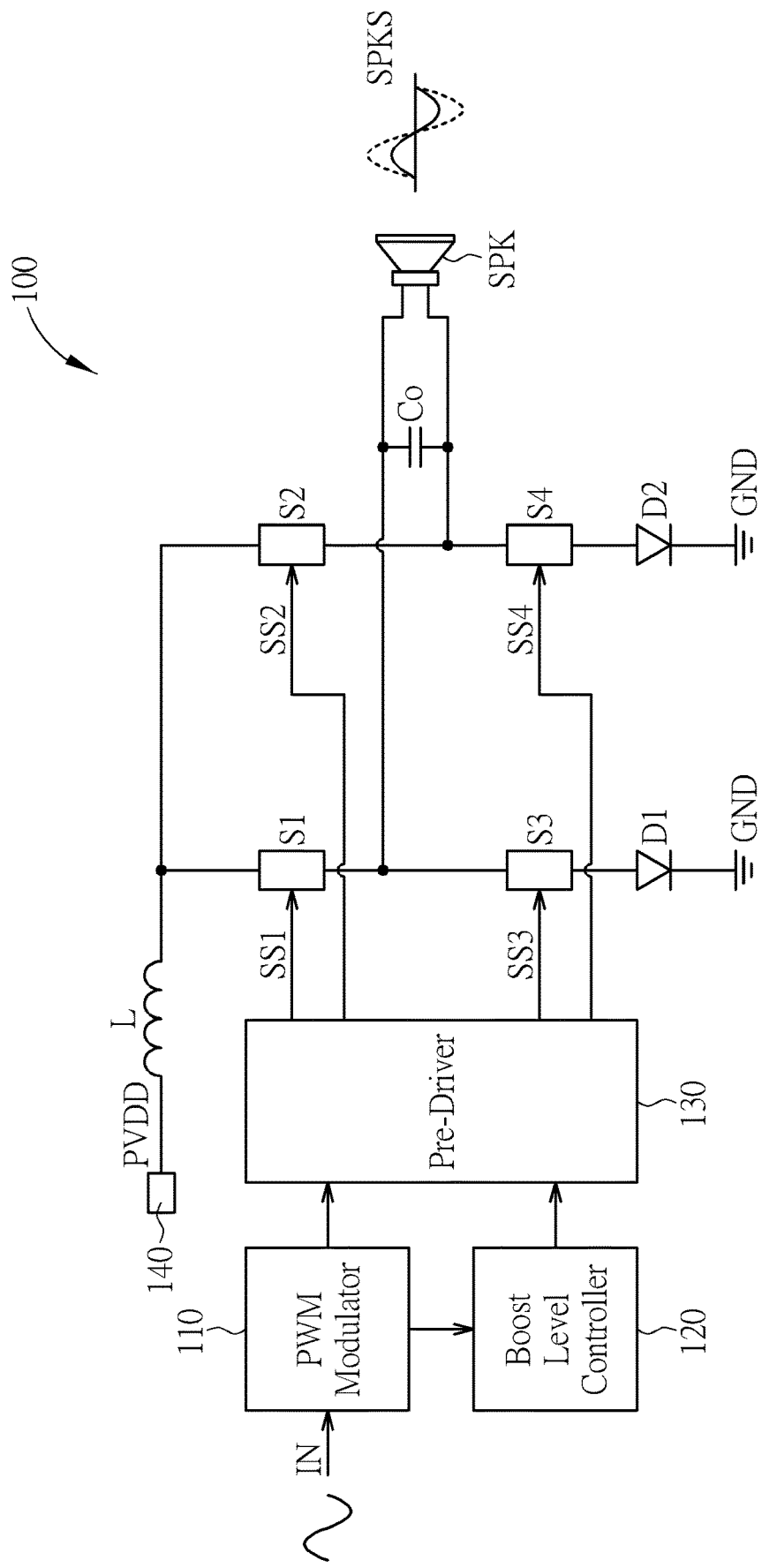
FIG. 1 is a diagram illustrating a boost class-D amplifier of an embodiment.

FIG. 1 is the diagram illustrating a boost class-D amplifier 100 of an embodiment. The boost class-D amplifier 100 include a PWM (pulse width modulation) modulator 110, a boost level controller 120 coupled to the PWM modulator 110, a pre-driver 130 coupled to the PWM modulator 110 and the boost level controller 120, a system voltage source 140, an inductor L coupled to the system voltage source 140, a first switch S1, a second switch S2, a third switch S3, a fourth switch S4, a first diode D1 coupled between the third switch S3 and a voltage ground GND, a second diode D2 coupled between the fourth switch S4 and the voltage ground GND, and a capacitor Co coupled between the first switch S1 and the fourth switch S4.

The PWM modulator 110 is for receiving an input signal IN and generating a first modulated signal accordingly. The boost level controller 120 is for receiving the first modulated signal and generating a second modulated signal accordingly. The pre-driver 130 is for receiving the first modulated signal and the second modulated signal and generating a first control signal SS1, a second control signal SS2, a third control signal SS3 and a fourth control signal SS4 accordingly. The system voltage source 140 is for providing a system voltage PVDD.

The first switch S1 includes a first terminal coupled to the inductor L, a second terminal, and a control terminal coupled to the pre-driver 130 for receiving the first control signal SS1. The second switch S2 includes a first terminal coupled to the inductor L, a second terminal, and a control terminal coupled to the pre-driver 130 for receiving the second control signal SS2. The third switch S3 includes a first terminal coupled to the second terminal of the first switch S1, a second terminal, and a control terminal coupled to the pre-driver 130 for receiving the third control signal SS3. The fourth switch S4 includes a first terminal coupled to the second terminal of the second switch S2, a second terminal, and a control terminal coupled to the pre-driver 130 for receiving the fourth control signal SS4.

A speaker SPK functioning as the load can be coupled between the second terminal of the first switch S1 and the first terminal of the fourth switch S4. The capacitor Co and the inductor L form a filter for reducing voltage ripples. The first diode D1 and the second diode D2 are protection diodes for blocking reverse current flow.

Figure 2:
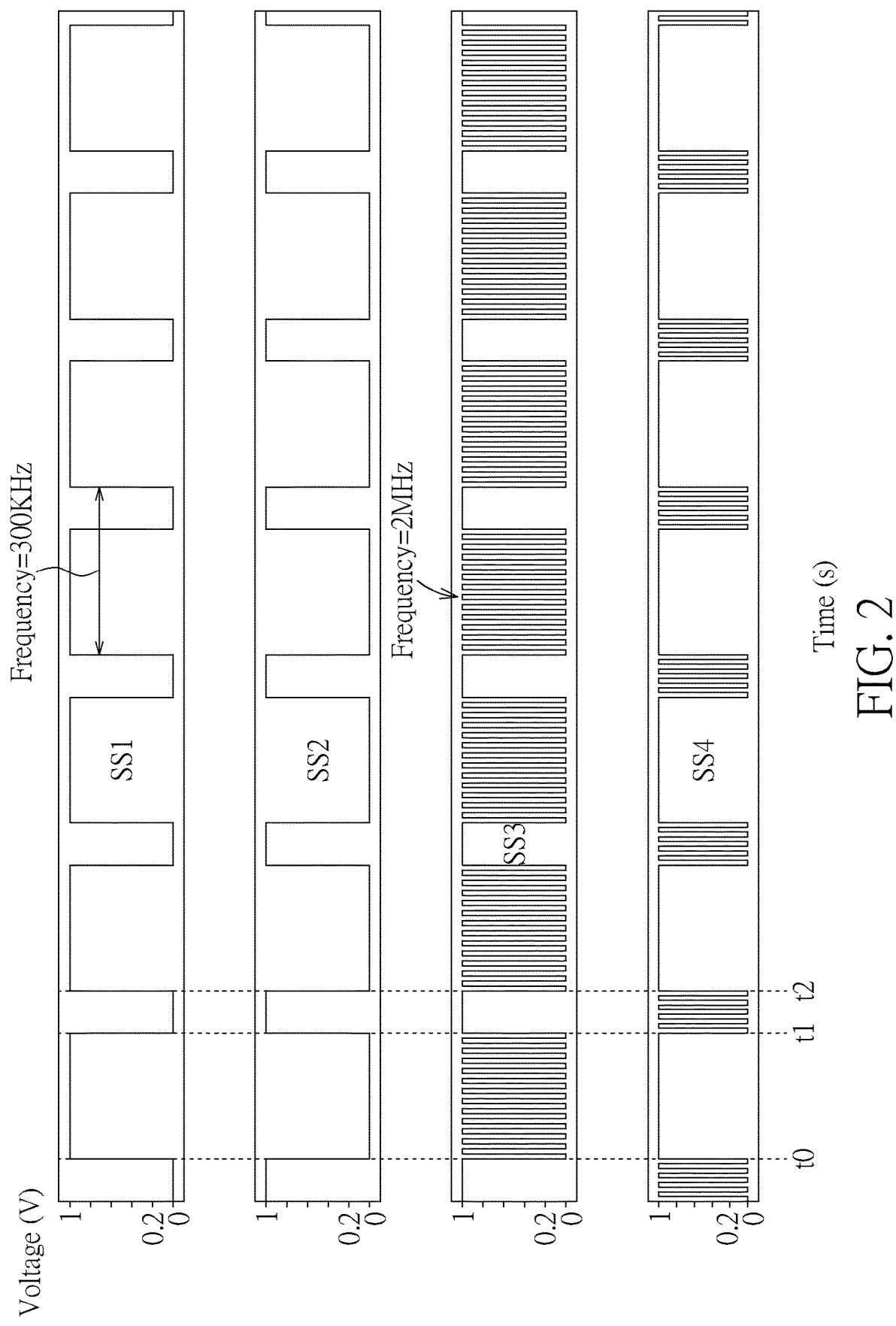
FIG. 2 is a diagram illustrating the control signals to the switches in FIG. 1.

FIG. 2 is the diagram illustrating the control signals to the switches in FIG. 1. As shown in FIG. 2, the control signal SS1 is a square wave signal with frequency of 300 kHz to the first switch S1. The control signal SS2, complementary to the control signal S1, is also a square wave signal to the second switch S2. The control signal SS3 is a square wave signal composite with pulse width modulation signal with frequency of 2 MHz to the third switch S3. The control signal SS4 is also a square wave signal composite with pulse width modulation signal with frequency of 2 MHz to the fourth switch S4. When the first control signal SS1 has a high voltage, the third control signal SS3 has a high frequency PWM signal and the fourth control SS4 signal has a high voltage. When the first control signal SS1 has a low voltage, the third control SS3 signal has a high voltage and the fourth control SS4 signal has a high frequency PWM signal.

Figure 3:
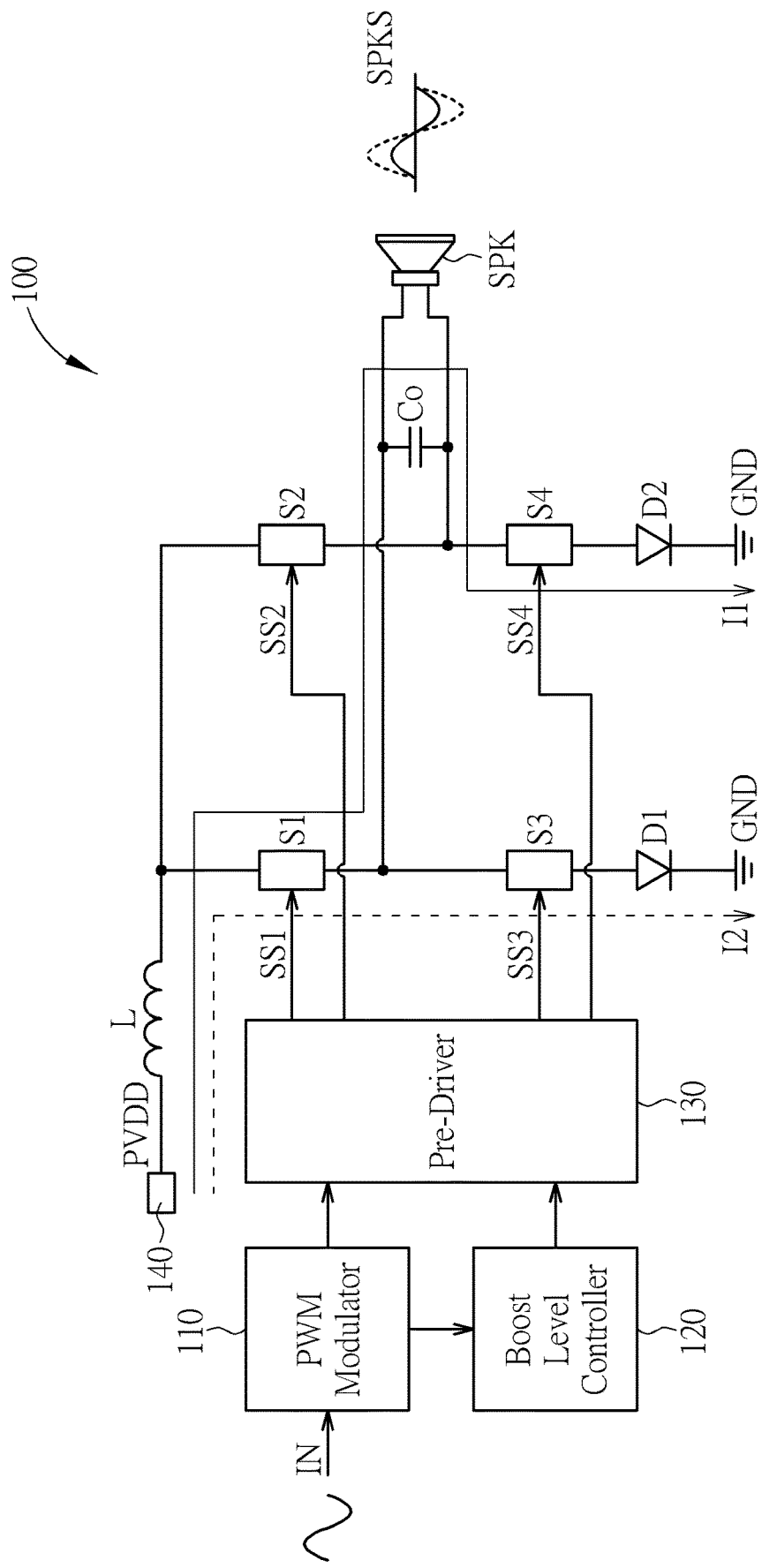
FIGS. 3 and 4 are the diagrams illustrating the operating current of the boost class-D amplifier.
Figure 4:
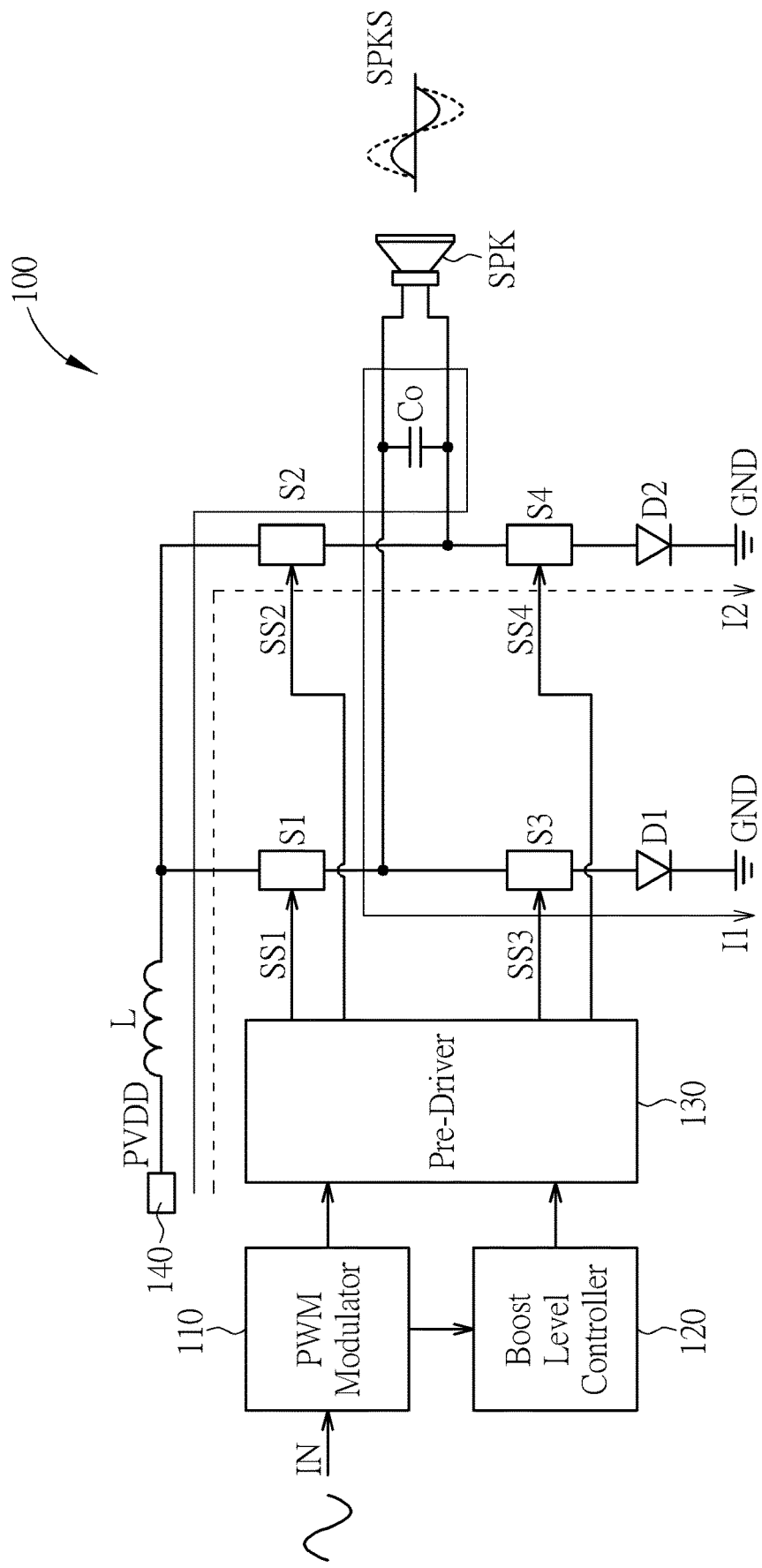

FIGS. 3 and 4 are the diagrams illustrating the operating current of the boost class-D amplifier. Between time t0 to time t1 (FIG. 2), the control signal SS1 has a high voltage, and the control signal SS2 has a low voltage, SS4 has a high voltage, and the control signal SS3 has a PWM signal which causes the third switch S3 to switch at frequency of 2 MHz. When the third switch S3 is off, the current I1 can go from the system voltage source 140, passing through the inductor L, the first switch S1, the capacitor Co and the speaker SPK, the fourth switch S4, the second diode D2, to the voltage ground GND. When the third switch S3 is on, another current I2 can go from the system voltage source 140, passing through the inductor L, the first switch S1, the third switch S3, the first diode D1 to the voltage ground GND. During this time, the inductor L would be charged by generating a magnetic field. Then, when the third switch S3 turns off, the magnetic field previously created will be discharged to the current I1 towards the speaker SPK.

Between time t1 to time t2, the control signal SS1 has a low voltage, and the control signal SS2 has a high voltage, SS3 has a high voltage, and the control signal SS4 has a PWM signal which causes the third switch S4 to switch at frequency of 2 MHz. When the fourth switch S4 is off, the current I1 can go from the system voltage source 140, passing through the inductor L, the second switch S2, the capacitor Co and the speaker SPK, the third switch S3, the first diode D1, to the voltage ground GND. When the fourth switch S4 is on, another current I2 can go from the system voltage source 140, passing through the inductor L, the second switch S2, the fourth switch S4, the second diode D2, to the voltage ground GND. During this time, the inductor L would be charged by generating a magnetic field. Then, when the fourth switch S4 turns off, the magnetic field previously created will be discharged to the current I1 towards the speaker SPK.

The voltage boost function of the circuit can be expressed as following:

$$V_o = PVDD \times k \times (1-d^2)$$

In this equation, $V_o$ represents the output voltage and PVDD represents the system voltage. The lowercase k represents a boosting ratio of the boost converter. The lowercase d represents the duty ratio of the high frequency PWM signal. Therefore, the high frequency on and off switching of the third switch S3 and the fourth switch S4 can boost the voltage of the output signal SPKS as described.

Figure 5:
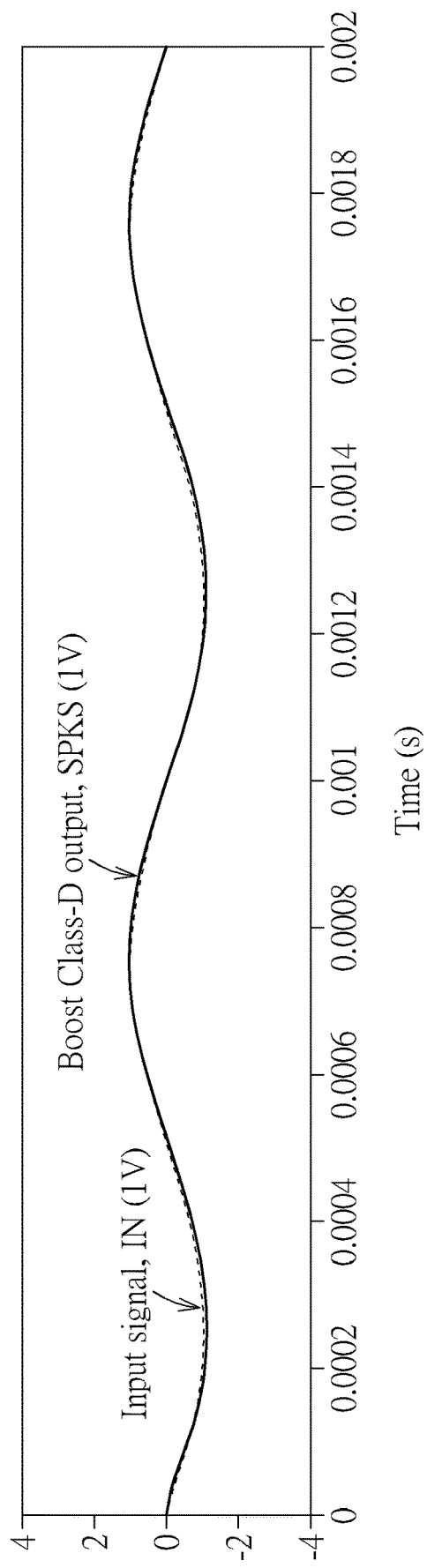
FIG. 5 is a diagram illustrating the input signal and output signal of the boost class-D amplifier.

FIG. 5 is a diagram illustrating the input signal and output signal of the boost class-D amplifier 100 when the duty ratio of the high frequency PWM signal is 99%. In this embodiment, the input signal IN is a sinusoidal wave with amplitude of 1V. The output signal SPKS is measured at the speaker SPK. As shown in the figure, when the duty ratio of the high frequency PWM signal operates at 99%, the input signal IN and the output signal SPKS can almost overlap each other. This shows that the circuit architecture of the boost class-D amplifier 100 can at least minimize the harmonic distortion and approximately reproduce the input signal IN at the speaker SPK.

Figure 6:
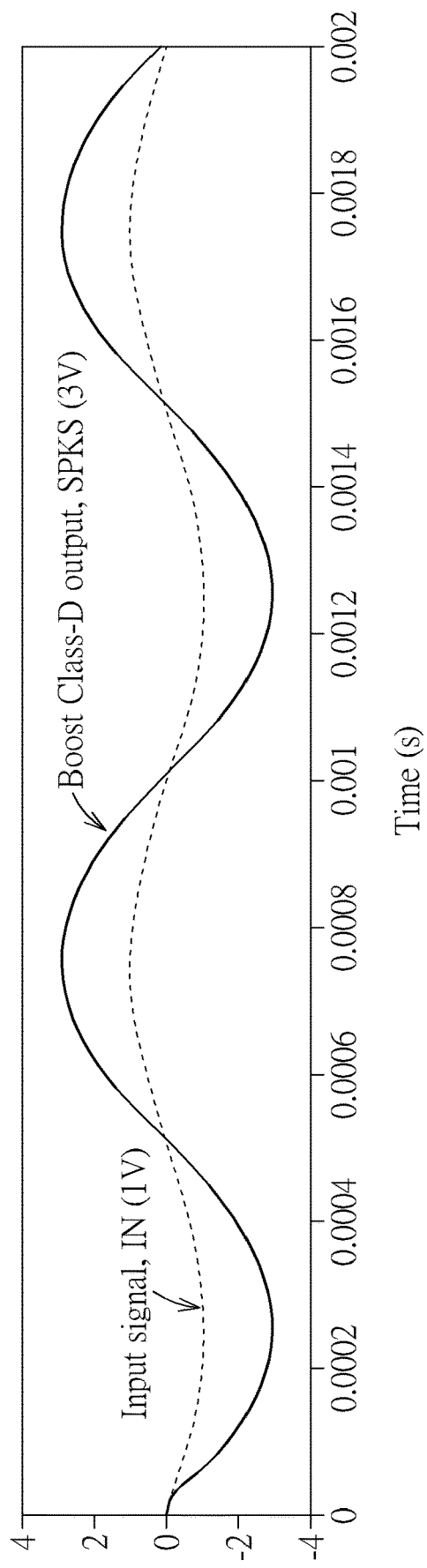
FIG. 6 is another diagram illustrating the input and output signal the boost class-D amplifier.

FIG. 6 is a diagram illustrating the input and output signal the boost class-D amplifier 100 when the duty ratio of the high frequency PWM signal is 40%. In this embodiment, the input signal IN is a sinusoidal wave with amplitude of 1V. The output signal SPKS is measured at the speaker SPK. As shown in the figure, when the duty ratio of the high frequency PWM signal operates at 40%, the output signal SPKS can be amplified to 3V. This shows that the circuit architecture of the boost class-D amplifier 100 is able to amplify the input signal IN according to the duty ratio of the high frequency PWM signal. The embodiment combines a class-D amplifier and a boost converter in an efficient way without having a significant impact on the signal integrity.

Figure 7:
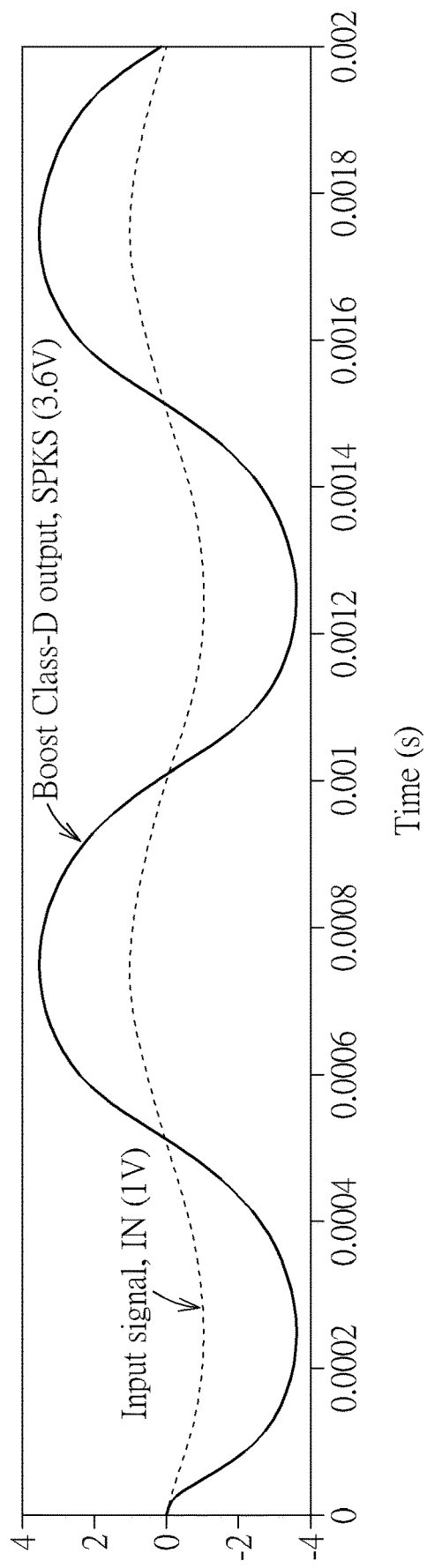
FIG. 7 is another diagram illustrating the input and output signal the boost class-D amplifier.

FIG. 7 is a diagram illustrating the input and output signal the boost class-D amplifier 100 when the duty ratio of the high frequency PWM signal is 10%. In this embodiment, the input signal IN is a sinusoidal wave with amplitude of 1V. The output signal SPKS is measured at the speaker SPK. As shown in the figure, when the duty ratio of the high frequency PWM signal operates at 10%, the output signal SPKS can be amplified to 3.6V. This shows that the circuit architecture of the boost class-D amplifier 100 is able to amplify the input signal IN according to the duty ratio of the high frequency PWM signal. As the duty ratio decreases, the power boost factor increases. The embodiment combines class-D amplifier and boost converter in an efficient way without having a significant impact on the signal integrity.

Figure 8:
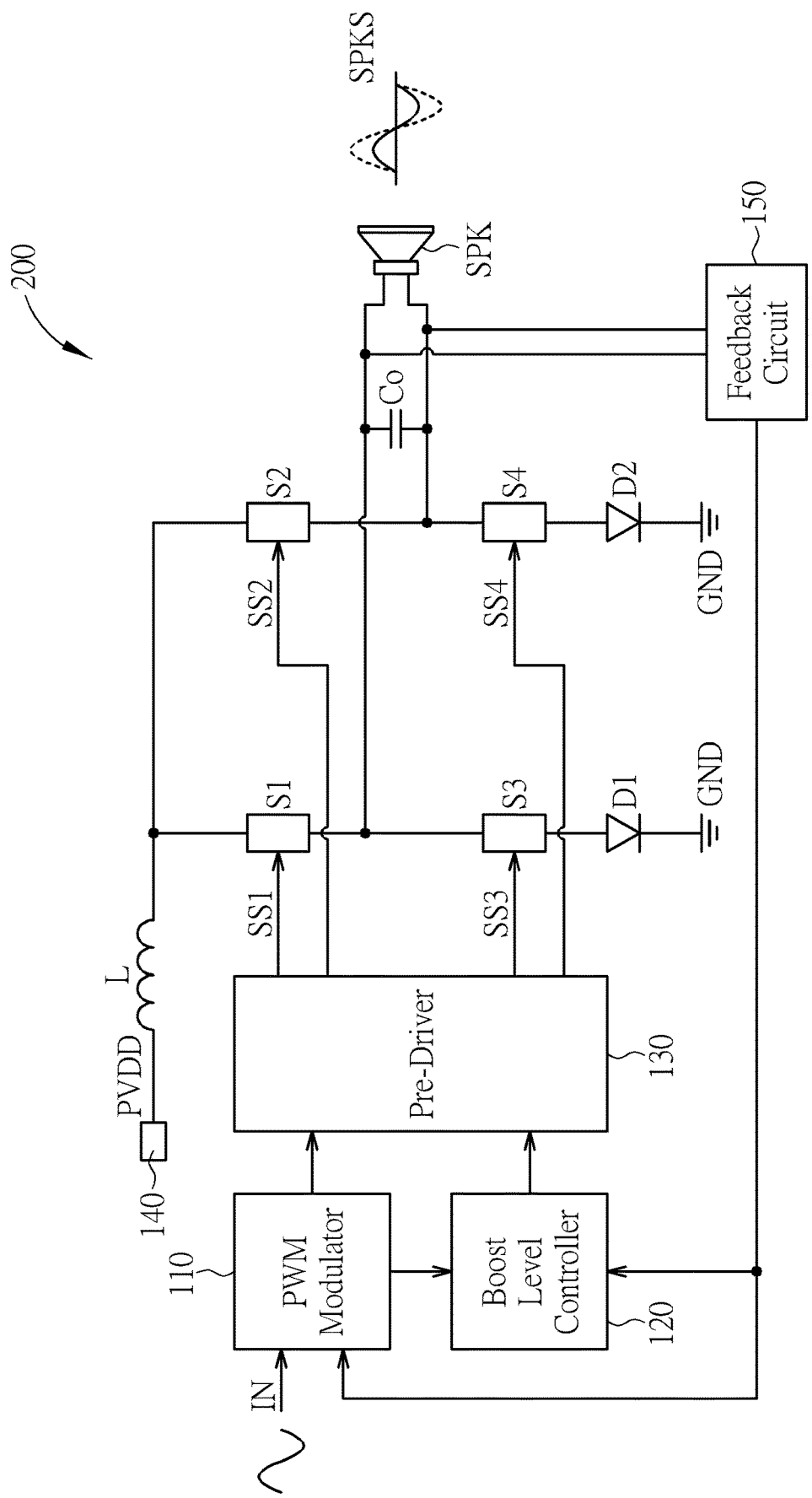
FIG. 8 is the diagram illustrating a boost class-D amplifier of another embodiment.

FIG. 8 is the diagram illustrating a boost class-D amplifier 200 of another embodiment. The boost class-D amplifier 100 include a PWM (pulse width modulation) modulator 110, a boost level controller 120 coupled to the PWM modulator 110, a pre-driver 130 coupled to the PWM modulator 110 and the boost level controller 120, a system voltage source 140, an inductor L coupled to the system voltage source 140, a first switch S1, a second switch S2, a third switch S3, a fourth switch S4, a first diode D1 coupled between the third switch S3 and a voltage ground GND, a second diode D2 coupled between the fourth switch S4 and the voltage ground GND, and a capacitor Co coupled between the first switch S1 and the fourth switch S4.

The difference between the embodiment of boost class-D amplifier 100 in FIG. 1 and the embodiment of boost class-D amplifier 200 in FIG. 8 is that boost class-D amplifier 200 further comprises a feedback circuit 150 coupled to both terminals of the capacitor Co, the boost level controller 130 and the PWM modulator 110. The feedback circuit 150 returns a portion of the output signal SPKS to the boost level controller 130 and the PWM modulator 110 for stabilizing the first modulated signal and the second modulated signal. The feedback error signal is formed by comparing the output signal SPKS with the input signal IN and can be used in the feedback circuit 150 to control signal distortion. The implementation of feedback circuit 150 can produce more uniform amplification over a range of frequencies and desensitize gain to component variations.

In conclusion, the boost class-D amplifier of the embodiments of the present invention combines a class-D amplifier and a boost converter in a single stage in an efficient way without having a significant impact on the signal integrity. There is no need of a separate boost converter to drive the class-D amplifier. The boost class-D amplifier of the embodiments can improve power conversion efficiency and output high quality signals with low total harmonic distortion.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A boost class-D amplifier comprising:
    a PWM (pulse width modulation) modulator configured to receive an input signal and generate a first modulated signal accordingly;
    a boost level controller coupled to the PWM modulator, configured to receive the first modulated signal and generate a second modulated signal accordingly;
    a pre-driver coupled to the PWM modulator and the boost level controller and configured to receive the first modulated signal and the second modulated signal and generate a first control signal, a second control signal, a third control signal and a forth control signal accordingly;
    a system voltage source configured to provide a system voltage;
    an inductor coupled to the system voltage source;
    a first switch comprising:
        a first terminal coupled to the inductor;
        a second terminal; and
        a control terminal coupled to the pre-driver and configured to receive the first control signal;
    a second switch comprising:
        a first terminal coupled to the inductor;
        a second terminal; and
        a control terminal coupled to the pre-driver and configured to receive the second control signal;
    a third switch comprising:
        a first terminal coupled to the second terminal of the first switch;
        a second terminal; and
        a control terminal coupled to the pre-driver and configured to receive the third control signal;
    a fourth switch comprising:
        a first terminal coupled to the second terminal of the second switch;
        a second terminal; and
        a control terminal coupled to the pre-driver and configured to receive the fourth control signal;
    a first diode coupled between the second terminal of the third switch and a voltage ground;
    a second diode coupled between the second terminal of the fourth switch and the voltage ground; and
    a capacitor coupled between the second terminal of the first switch and the first terminal of the fourth switch.

2. The boost class-D amplifier of claim 1 further comprising a speaker coupled between the second terminal of the first switch and the first terminal of the fourth switch.

3. The boost class-D amplifier of claim 1, wherein the first switch, the second switch, the third switch, and the fourth switch are bipolar junction transistors.

4. The boost class-D amplifier of claim 1, wherein the first switch, the second switch, the third switch, and the fourth switch are metal oxide semiconductor field effect transistor (MOSFET).

5. The boost class-D amplifier of claim 1, wherein the first control signal and the second control signal are complementary.

6. The boost class-D amplifier of claim 5 wherein when the first control signal has a high voltage, the second control signal has a low voltage, the third control signal has a high frequency PWM signal and the fourth control signal has a high voltage.

7. The boost class-D amplifier of claim 5 wherein when the first control signal has a low voltage, the second control signal has a high voltage, the third control signal has a high voltage and the fourth control signal has the high frequency PWM signal.

8. A boost class-D amplifier comprising:
    a PWM (pulse width modulation) modulator, configured to receive an input signal and generate a first modulated signal;

a boost level controller coupled to the PWM modulator, configured to receive the first modulated signal and output a second modulated signal;

a pre-driver coupled to the PWM modulator and the boost level controller;

a system voltage source, configured to provide a system voltage;

an inductor coupled to the system voltage source;

a first switch comprising:
 a first terminal coupled to the inductor;
 a second terminal; and
 a control terminal coupled to the pre-driver and configured to receive the first control signal;

a second switch comprising:
 a first terminal coupled to the inductor;
 a second terminal; and
 a control terminal coupled to the pre-driver and configured to receive the second control signal;

a third switch comprising:
 a first terminal coupled to the second terminal of the first switch;
 a second terminal; and
 a control terminal coupled to the pre-driver and configured to receive the third control signal;

a fourth switch comprising:
 a first terminal coupled to the second terminal of the second switch;
 a second terminal; and
 a control terminal coupled to the pre-driver and configured to receive the fourth control signal;

a first diode coupled to the second terminal of the third switch and a voltage ground;

a second diode coupled to the second terminal of the fourth switch and the voltage ground;

a capacitor coupled between the second terminal of the first switch and the first terminal of the fourth switch; and a feedback circuit coupled to both terminals of the capacitor, the boost level controller and the PWM modulator, and configured to stabilize the first modulated signal and the second modulated signal.

9. The boost class-D amplifier of claim 8 further comprising a speaker coupled between the second terminal of the first switch and the first terminal of the fourth switch.

10. The boost class-D amplifier of claim 8, wherein the first switch, the second switch, the third switch, and the fourth switch are bipolar junction transistors.

11. The boost class-D amplifier of claim 8, wherein the first switch, the second switch, the third switch, and the fourth switch are metal oxide semiconductor field effect transistor (MOSFET).

12. The boost class-D amplifier of claim 8, wherein the first control signal and the second control signal are complementary.

13. The boost class-D amplifier of claim 12 wherein when the first control signal has a high voltage, the second control signal has a low voltage, the third control signal has a high frequency PWM signal and the fourth control signal has a high voltage.

14. The boost class-D amplifier of claim 12 wherein when the first control signal has a low voltage, the second control signal has a high voltage, the third control signal has a high voltage and the fourth control signal has the high frequency PWM signal.

* * * * *